United States Patent
Hall

(10) Patent No.: US 7,559,155 B2
(45) Date of Patent: Jul. 14, 2009

(54) METHOD AND SYSTEM FOR DRYING SEMICONDUCTOR WAFERS IN A SPIN COATING PROCESS

(75) Inventor: David C. Hall, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1223 days.

(21) Appl. No.: 10/847,549

(22) Filed: May 17, 2004

(65) Prior Publication Data

US 2004/0209417 A1    Oct. 21, 2004

Related U.S. Application Data

(62) Division of application No. 10/326,351, filed on Dec. 2, 2002.

(60) Provisional application No. 60/343,633, filed on Dec. 28, 2001.

(51) Int. Cl.
*F26B 5/08* (2006.01)

(52) U.S. Cl. .................... 34/325; 34/58; 34/312
(58) Field of Classification Search .............. 34/312, 34/314, 320, 325, 410, 582, 58
See application file for complete search history.

(56) References Cited

U.S. PATENT DOCUMENTS

| 4,637,146 | A | * | 1/1987 | Motoki et al. | .......... 34/58 |
| 5,884,412 | A | * | 3/1999 | Tietz et al. | ........... 34/58 |
| 5,954,072 | A | * | 9/1999 | Matusita | ............ 134/149 |
| 5,960,555 | A | * | 10/1999 | Deaton et al. | ......... 34/58 |
| 6,263,586 | B1 | * | 7/2001 | Linliu | ............... 34/312 |
| 6,662,466 | B2 | * | 12/2003 | Gurer et al. | .......... 34/317 |

* cited by examiner

*Primary Examiner*—Kenneth B Rinehart
(74) *Attorney, Agent, or Firm*—Rose Alyssa Keagy; Wade J. Brady, III; Frederick J. Telecky, Jr.

(57) ABSTRACT

The invention provides methods and apparatus for drying the backside of semiconductor wafers in a spin-coating environment. Solvent is evaporatively dried from a semiconductor wafer held in a spin mechanism. The undried wafer is sprayed with one or more jets of pressurized gas from gas ports disposed about the spin mechanism.

21 Claims, 1 Drawing Sheet

METHOD AND SYSTEM FOR DRYING SEMICONDUCTOR WAFERS IN A SPIN COATING PROCESS

PRIORITY DATE

This is a division of application Ser. No. 10/326,351, filed Dec. 2, 2002, the entire disclosure of which is hereby incorporated by reference.

This application claims the benefit of U.S. Provisional Application No. 60/343,633 filed Dec. 28, 2001.

TECHNICAL FIELD

The invention relates to methods and systems for drying semiconductor wafers in conjunction with a spin coating manufacturing process. More particularly, the invention relates to the use of one or more streams of pressurized gas to evaporatively dry solvent from the backside of a semiconductor wafer.

BACKGROUND OF THE INVENTION

Spin coating is a procedure that utilizes centrifugal forces created by a spinning substrate to uniformly spread a coating solution over a surface. This coating technique is relatively fast and efficient and is used in semiconductor wafer production.

In general, a spin mechanism is the heart of the spin coating process. The spin mechanism requires a holder for the wafer, generally, a vacuum chuck, a motor and a controller for spinning at a predetermined spin rate and time and a spin cup to catch excess fluids. A typical spin process consists of dispensing a coating solution onto a substrate mounted on the wafer chuck. The spin speed of the substrate is then increased to the predetermined rate for a predetermined period of time. During the spin time, the coating solution spreads across the substrate and most of the excess solution is forced off the edge. The wafer is then slowed at a given rate until it becomes stationary and can be removed from the chuck.

Generally, coating solutions with higher viscosity require a higher spin rate and spin coating solutions with less viscosity can be spun at a slower rate.

In general, the material to be made into the coating is dissolved or dispersed in a solvent and the coating solution thus comprised is spun off leaving a uniform layer for subsequent processing stages. Spin coating is known in the art for photo-resist for defining in patterns in microcircuit fabrication, magnetic disk coatings, compact discs, and for applying various anti-reflection and conductive coatings.

One area of particular concern with spin coating is edge effects. The edge of the wafer can be a source of difficulty in spin coating for several reasons. Surface tension effects may make it difficult for coating solution flowing radially outward on the wafer to detach from the wafer edge, thus, a small ridge of liquid can remain attached around the entire perimeter resulting in thicker coatings in this edge zone. In addition, if the wafer is not precisely round, the airflow over the protruding parts may result in non-uniformity in coating thickness. Increasing the coating solution viscosity can help to reduce edge effects, as can slowing the spin rate. These solutions to the edge effect problem are not entirely satisfactory, however. It is not always practical to thin the coating solution, and slower spin rates may result in longer processing times with a corresponding increase in expense.

Methods and apparatus providing the capability of performing backside rinsing without reintroducing contamination from the coating material would be useful and desirable in the art. Methods and apparatus capable of speeding the drying of spin coated semiconductor wafers would also be desirable in terms of savings in time and costs.

SUMMARY OF THE INVENTION

In general, methods and apparatus for drying the backside of semiconductor wafers in a spin-coating environment are disclosed.

According to one aspect of the invention, a method of drying the backside of a semiconductor wafer during spin coating includes steps of spinning an undried wafer in a spin mechanism and spraying the backside of the wafer with one or more jets of pressurized gas to evaporatively dry the backside of the wafer.

According to another aspect of the invention, the pressurized gas is purified pressurized nitrogen gas.

Apparatus according to another aspect of the invention includes a spin mechanism for spin coating a semiconductor wafer secured in a wafer chuck, the mechanism having a wafer chuck for securing the wafer. One or more gas ports are provided for evaporatively drying the backside of the wafer.

According to yet another aspect of the invention, apparatus for drying solvent from the backside of a spin coated semiconductor wafer includes a spin mechanism having a wafer chuck for securing the wafer and a spin cup for encircling the wafer. The apparatus further includes one or more gas ports adapted to deliver one or more pressurized gas jets to the backside of a wafer secured to the spin chuck to evaporatively dry solvent from the backside of the wafer. Means for delivering pressurized gas to the one or more gas ports is also provided.

Technical advantages are provided by the invention, including but not limited to, cleaner and faster drying of spin-coated semiconductor wafers. A further advantage is realized in the ability of drying wafers more rapidly at slower spin speeds. These and other advantages of the invention provide further advantages in terms of savings in production time and costs. These and many other advantages related to the improvements of the invention will become apparent to persons skilled in the relevant arts through careful reading of the following specification including the drawings presented herein.

BRIEF DESCRIPTION OF THE DRAWINGS

For a better understanding of the invention including its features, advantages and specific embodiments, reference is made to the following detailed description along with accompanying drawings in which.

References in the detailed description correspond to like references in the figures unless otherwise noted. Like numerals refer to like parts throughout the various figures. The descriptive and directional terms used in the written description such as top, bottom, left, right, etc., refer to the drawings themselves as laid out on the paper and not to physical limitations of the invention unless specifically noted. The drawings are not to scale and some features of embodiments shown and discussed are simplified or exaggerated for illustrating the principles of the invention.

DETAILED DESCRIPTION OF PREFERRED EMBODIMENTS

Figure 1:
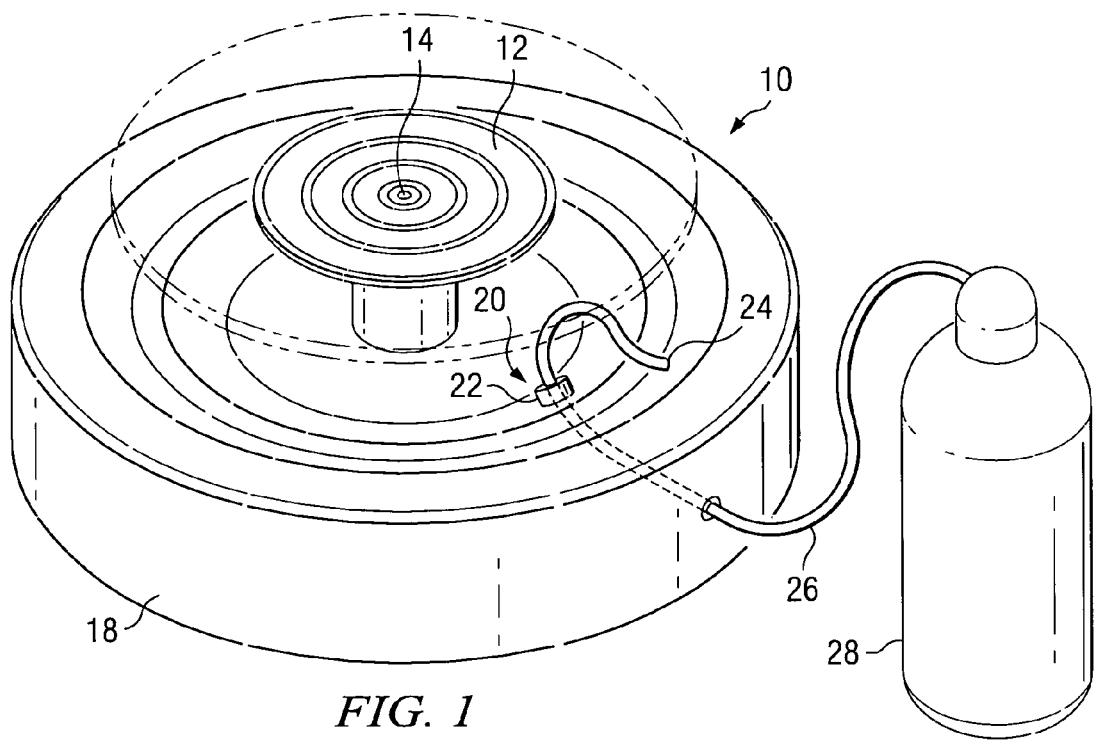
FIG. 1 is a top perspective view showing an example of a preferred embodiment of the invention.

A preferred embodiment of the invention is shown in the example of FIG. 1. A spin mechanism 10 is shown having a wafer chuck 12 with a vacuum port 14 therein for securing the wafer "W" (not part of the invention). A spin cup 18 typically surrounds the wafer "W" to catch excess coating solution. The spin mechanism 10 shown and described thus far is typical in the arts and is not intended to place limitations on the invention. As shown in FIG. 1, a gas port 20 is affixed to the spin cup at an attachment point 22. The gas port 20, may be equipped with a nozzle 24 focusing and/or dispersing pressurized gas supplied by gas line 26 from an external gas source 28, such as a tank of pressurized gas or a compressor (not shown). In the embodiment of the invention shown in FIG. 1, a single gas port 20 is provided. The gas port 20 is positioned such that it directs a jet of pressurized gas, preferably purified pressurized gas, toward the backside of the semiconductor wafer "W" to promote evaporation of coating solution and/or solvent from the wafer "W."

In general, more viscous coating solutions may benefit from having more gas ports, whereas less viscous solutions may require fewer gas ports. The invention may be practiced with one or a plurality of gas ports and with or without nozzles according to the solution being used and the spin speed. Preferably when multiple gas ports are employed they are evenly spaced about the spin cup.

Figure 2:
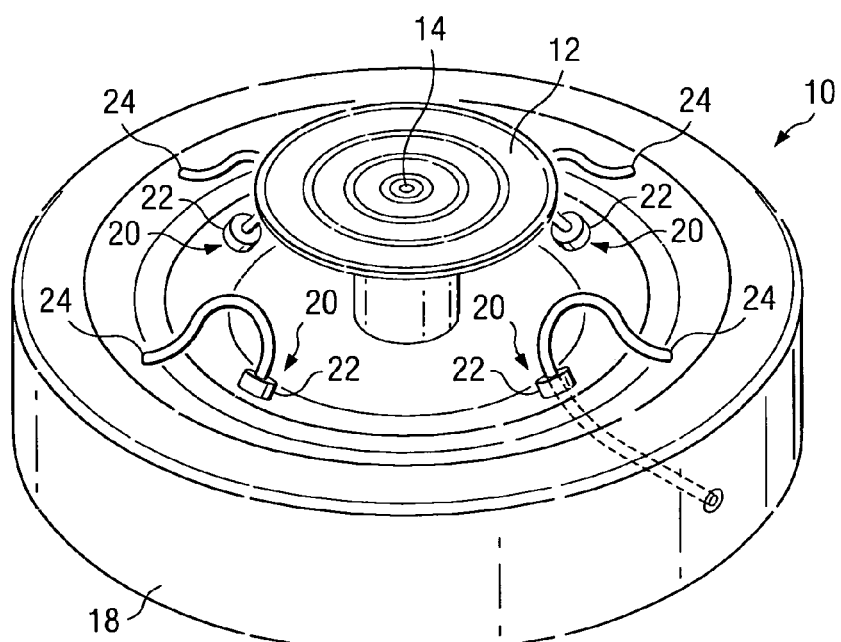
FIG. 2 is a top view showing an additional example of a preferred embodiment of the invention.

FIG. 2 depicts a top view of a further example of a preferred embodiment of the invention. An embodiment of the invention having a plurality of gas ports 20 is shown. The multiple spin ports 20 are symmetrically spaced about the spin cup such that jets of pressurized gas, preferably purified pressurized nitrogen, are arranged to cause an even evaporation of the coating solution from the wafer "W" mounted in the spin mechanism 10.

Of course, various types of solvents, such as isopropyl alcohol (IPA), acetone or PGMEA or MIBK, may be used. Additionally, alternative pressurized gases such as purified pressurized air may also be substituted for the purified nitrogen gas of this example. Various alterations of the apparatus and methods shown in FIGS. 1 and 2 may be employed without departing from the concept of the invention using pressurized gas to promote evaporative drying of the backside of spin coated semiconductor wafers. The wafers themselves may be silicon wafers or other semiconductor wafers, such as, gallium arsenide or silicon carbide, for example.

As a result of using evaporative drying of spin coated wafers it is possible to dry wafers at low spin speed in a cleaner, faster and accordingly, less expensive manner than by spinning alone. The apparatus and methods of the invention may be employed with new spin mechanisms or may be advantageously implemented with pre-existing spin mechanisms thereby extending the utility and life span of older equipment.

Therefore, disclosed herein is a method of drying the backside of a semiconductor wafer during spin coating comprising the steps of: spinning an undried spin coated semiconductor wafer in a spin mechanism; spraying the backside of the undried spin coated semiconductor wafer with one or more jets of purified pressurized gas thereby evaporatively drying the backside of the wafer. This spraying step can be accomplished by spraying one, two, three or four jets of purified pressurized gas. In other embodiments, five or more jets of purified pressurized gas are used. Likewise, the spraying step can be accomplished by spraying purified pressurized nitrogen gas or purified pressurized air.

Also disclosed is an apparatus for drying the backside of a semiconductor wafer comprising: a spin mechanism for spin coating a semiconductor wafer, the spin mechanism having a wafer chuck for securing the wafer; and one or more gas ports adapted to deliver one or more pressurized gas jets to the backside of a semiconductor wafer secured to the spin chuck for evaporatively drying the backside of the semiconductor wafer. The apparatus can further comprise one or more nozzles coupled to the one or more gas ports. Likewise, the spin mechanism can further comprise a spin cup for encircling a semiconductor wafer secured to the spin chuck wherein one or more gas ports are affixed to the spin cup.

According to various embodiments, the apparatus can comprise one, two, three, or four gas ports. Still in other embodiments, five or more gas ports are used. The apparatus can further comprise means for delivering pressurized gas, such as pressurized nitrogen gas, to the gas ports. Alternatively, pressurized air is delivered to the gas ports.

Further disclosed is an apparatus for drying solvent from the backside of a spin coated semiconductor wafer comprising: a spin mechanism for use in spin coating a semiconductor wafer, the spin mechanism having a wafer chuck for securing the wafer and a spin cup for encircling the wafer; one or more gas ports adapted to deliver one or more pressurized gas jets to the backside of a semiconductor wafer secured to the spin chuck for evaporatively drying solvent from the backside of the semiconductor wafer; and means for delivering pressurized gas to the one or more gas ports.

The apparatus can further comprise one or more nozzles coupled to the one or more gas ports as well as one or more gas ports affixed to the spin cup. The number of gas ports can vary from according to various embodiments and may range from one, two, three or four gas ports. Still in other embodiments, five or more gas ports are used.

The embodiments shown and described above are only exemplary. Even though numerous characteristics and advantages of the present invention have been set forth in the foregoing description together with details of the method and device of the invention, the disclosure is illustrative only and changes may be made within the principles of the invention to the full extent indicated by the broad general meaning of the terms used in the attached claims.

I claim:

1. Apparatus for drying the backside of a semiconductor wafer comprising:
    a spin mechanism for spin coating a semiconductor wafer, the spin mechanism having a wafer chuck for securing the wafer; and
    one or more gas ports adapted to deliver one or more pressurized gas jets to the backside of a semiconductor wafer secured to the spin chuck for evaporatively drying the backside of the semiconductor wafer.

2. Apparatus according to claim 1 further comprising one or more nozzles coupled to the one or more gas ports.

3. Apparatus according to claim 1 wherein the spin mechanism further comprises a spin cup for encircling a semiconductor wafer secured to the spin chuck wherein one or more gas ports are affixed to the spin cup.

4. Apparatus according to claim 1 further comprising a single gas port.

5. Apparatus according to claim 1 further comprising two gas ports.

6. Apparatus according to claim 1 further comprising three gas ports.

7. Apparatus according to claim 1 further comprising four gas ports.

8. Apparatus according to claim 1 further comprising five or more gas ports.

9. Apparatus according to claim 1 further comprising means for delivering pressurized gas to the one or more gas ports.

10. Apparatus according to claim 1 further comprising means for delivering pressurized nitrogen gas to the one or more gas ports.

11. Apparatus according to claim 1 further comprising means for delivering pressurized air to the one or more gas ports.

12. Apparatus for drying solvent from the backside of a spin coated semiconductor wafer comprising:

a spin mechanism for use in spin coating a semiconductor wafer, the spin mechanism having a wafer chuck for securing the wafer and a spin cup for encircling the wafer;

one or more gas ports adapted to deliver one or more pressurized gas jets to the backside of a semiconductor wafer secured to the spin chuck for evaporatively drying solvent from the backside of the semiconductor wafer; and means for delivering pressurized gas to the one or more gas ports.

13. Apparatus according to claim 12 further comprising one or more nozzles coupled to the one or more gas ports.

14. Apparatus according to claim 12 wherein one or more gas ports are affixed to the spin cup.

15. Apparatus according to claim 12 further comprising a single gas port.

16. Apparatus according to claim 12 further comprising two gas ports.

17. Apparatus according to claim 12 further comprising three gas ports.

18. Apparatus according to claim 12 further comprising four gas ports.

19. Apparatus according to claim 12 further comprising five or more gas ports.

20. Apparatus according to claim 12 further comprising means for delivering pressurized nitrogen gas to the one or more gas ports.

21. Apparatus according to claim 12 further comprising means for delivering pressurized air to the one or more gas ports.

\* \* \* \* \*